US006635407B1

(12) United States Patent
Lokhorst et al.

(10) Patent No.: US 6,635,407 B1
(45) Date of Patent: *Oct. 21, 2003

(54) TWO PASS PROCESS FOR PRODUCING A FINE PITCH LEAD FRAME BY ETCHING

(75) Inventors: Gijsbert W. Lokhorst, Enter (NL); Robert M. Fritzsche, Attleboro Falls, MA (US); Ronald B. Wheelock, Attleboro, MA (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 333 days.

(21) Appl. No.: 09/178,848

(22) Filed: Oct. 26, 1998

Related U.S. Application Data

(60) Provisional application No. 60/063,553, filed on Oct. 28, 1997.

(51) Int. Cl.[7] ................................. G03C 5/00
(52) U.S. Cl. ....................... 430/312; 430/313; 430/316; 430/318; 430/319
(58) Field of Search .................. 430/311, 313, 430/314, 318, 316, 312, 319; 216/13, 14, 41

(56) References Cited

U.S. PATENT DOCUMENTS

| 5,221,428 A | * | 6/1993 | Ohsawa et al. ............. 430/318 |
| 5,286,342 A | | 2/1994 | Tsuji .......................... 156/645 |
| 5,454,905 A | * | 10/1995 | Fogelson ..................... 216/14 |
| 5,847,460 A | * | 12/1998 | Liou et al. ................... 257/751 |

FOREIGN PATENT DOCUMENTS

| DE | 2113829 | * | 5/1972 |
| JP | 61170053 | | 7/1986 |
| JP | 5029520 | | 2/1993 |
| JP | 5114680 | | 5/1993 |
| JP | 7335804 | | 12/1995 |

* cited by examiner

*Primary Examiner*—Mark F. Huff
*Assistant Examiner*—Saleha R. Mohamedulla
(74) *Attorney, Agent, or Firm*—Wade James Brady, III; Frederick J. Telecky, Jr.

(57) ABSTRACT

A method of fabricating a lead frame. The method includes providing an electrically conductive layer having a pair of opposing major surfaces. A pattern is etched in the layer extending partially through the layer to form cavities with sidewalls in the layer. A patterned mask is provided on the etched layer including masking of the sidewalls. The layer is again etched within the cavities. The patterned mask is preferably a liquid photo resist and the electrically conductive layer is preferably one of a copper or copper-based material or ALLOY 42. The etch can take place from both major surfaces.

19 Claims, 2 Drawing Sheets

TWO PASS PROCESS FOR PRODUCING A FINE PITCH LEAD FRAME BY ETCHING

This application claims priority under 35 USC 119(e)(1) of provisional application No. 60/063,553 filed Oct. 28, 1997.

BACKGROUND OF THE INVENTION

1. Field of the Invention

This invention relates to a method of fabrication of lead frames for use in the fabrication of semiconductor devices.

2. Brief Description of the Prior Art

Lead frames are a standard component utilized in the fabrication of semiconductor devices. In general, during the fabrication of semiconductor devices, semiconductor chips are secured to a central portion of the lead frames with fine gold wire leads bonded to and extending from bond pads on the chip to lead fingers on the lead frame. The lead frame and chip are subsequently encapsulated with a portion of the lead fingers of the lead frame extending externally of the encapsulation for connection to the external environment, such as, for example, a printed wiring board (PWB). Lead frames having relatively large dimensions and/or a relatively low pin count have been produced from metal sheets by die punching. However, with the continuing decrease in the pitch available between leads, lead frames have been fabricated by use of a masking and etching of an electrically conductive thin sheet or foil as discussed in U.S. Pat. No. 5,221,428. Although current metal punching technology has achieved capability nearly equal to that of etching, the latter is still favored for new designs and low volume production due to the high cost of such metal punching tools, especially for very high pin count lead frames.

To fabricate a lead frames by etching, a photo resist pattern in the shape of the lead frame to be fabricated is applied to both sides of an electrically conductive metal, such as, for example, a foil, generally copper or a copper-based material or low expansion iron-nickel alloy, such as ALLOY 42. This foil with patterned photo resist thereon is then passed through an etcher wherein the metal which is not masked by the photo resist is removed by etching, such as, for example, with ferric or cupric chloride. After etching, the photo resist is stripped away and the lead frame is optionally ready for partial or complete plating to improve bonding and soldering properties of the metal, such plating, if utilized, generally being palladium or selective silver or gold. During this etching process, the foil is also subjected to underetching or undercutting wherein, as the metal foil is etched through, the pattern that is etched away is somewhat larger than the open areas in the original resist pattern due to sideways etching under the resist. The amount of undercutting is related to the thickness of the foil and increases with increase in foil thickness. As noted above, this effect is caused by the fact that the etchant is not only etching downward or normal to the plane of the foil surface, but also, at a somewhat slower etch rate, is also etching sideways or into the plane of the foil. In standard fabrication techniques, this effect is compensated for by biasing the photo resist pattern. However, if very fine slots are being fabricated in a relatively thick foil, as is now required for lead frames used in conjunction with the small geometries now required in semiconductor fabrication, it is necessary to reduce the width of the slots in the resist to the extent that they theoretically disappear. Since this is not a possible scenario, there exists a limit to the minimum slot width that can be etched for a given foil thickness. It is therefore apparent that new techniques are required whereby narrower slots can be etched than are available with prior art techniques for a given foil thickness. Such a new technique is et forth in U.S. Pat. No. 5,221,428 wherein, the undercutting of the prior art is reduced by reducing the thickness of selected portions of the foil and etching from both major surfaces. While undercutting is reduced, sideways etching still takes place at about half the rate as does etching normal to the plane of the foil.

SUMMARY OF THE INVENTION

In accordance with the present, the above problem of undercutting is minimized.

Briefly, in the external lead finger region of the lead frame, the assembly of the integrated circuit as well as the later assembly of the integrated circuit onto a printed circuit board requires a certain mechanical strength that can only be obtained by having a known minimum material thickness. Typically, only the inner leads that are within the plastic encapsulation have a very fine pattern with very narrow slots. In the outer area, the gaps are much wider. The prior art solution was to reduce the material thickness in the internal lead area by etching down in a separate pass through the etching process. The etching was accomplished from one or both sides of the foil, preferably from both sides of the foil. After the initial etching step was completed, the standard etching process for etching lead frames was then incorporated with a photo resist being used to reliably cover the vertical sides of the etch cavity. This prior art solution is altered in accordance with the present invention by stopping the etching of the foil after deposition of the first photo resist as soon as the material thickness that is left is sufficiently thin to enable the production of the fine features sought. The first photo resist is then stripped, the partially etched foil is cleaned in standard manner and a second, preferably liquid, photo resist is now applied which covers the foil and the cavities that were etched in the foil during the prior etching process. The second liquid photo resist can be applied from one or both sides of the foil. The second photo resist is then patterned and exposed, leaving the side walls along the cavities formed masked with the second exposed photo resist. After developing of the second photo resist, the substrate is again etched with the undercutting now minimized due to the presence of the second photo resist on the side walls. Accordingly, the undercutting is minimized. The second photo resist is then removed and processing continues in standard manner.

DESCRIPTION OF THE PREFERRED EMBODIMENT

Figure 1:
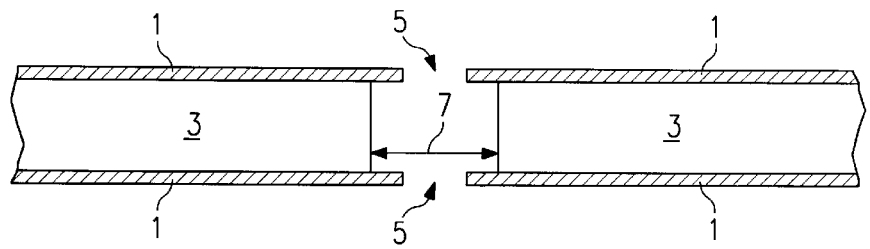
FIG. 1 is a schematic diagram showing undercutting during etching of a lead frame in accordance with the prior art.

Referring first to FIG. 1, there is provided a schematic diagram showing the undercutting that takes place using standard etching techniques in the fabrication of a lead frame. As shown, a patterned mask 1 is disposed on both sides of the foil 3 with desired etching to take place through the aperture 5 in the mask and normal to the surface of the mask. However, due to sideways etching, there is undercutting under the mask 1 whereby foil material 7 beneath the mask is removed along with the foil material directly beneath the aperture 5. In many instances, such as when the geometry of the remaining foil under the mask is small, the undercutting can seriously interfere with the electrical properties of the foil by removing the foil completely or thinning the foil to the extent that electrical conduction is impeded. It is this undercutting problem that the present invention minimizes.

Figure 2A:
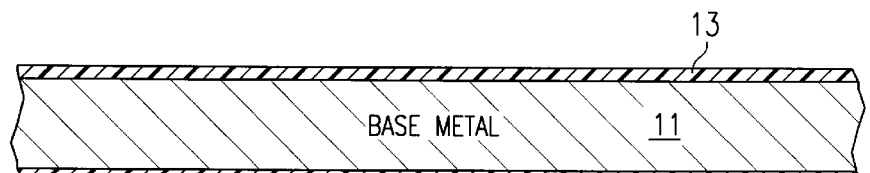
FIGS. 2A to 2F are a process flow for fabrication of a lead frame in accordance with the present invention.
Figure 2B:
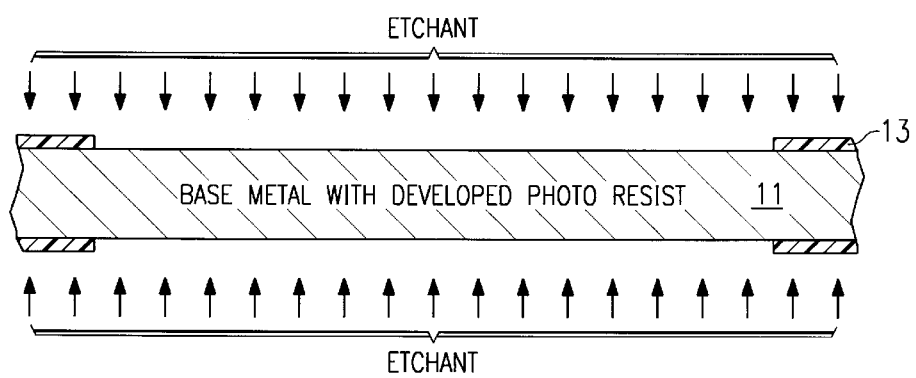
Figure 2C:
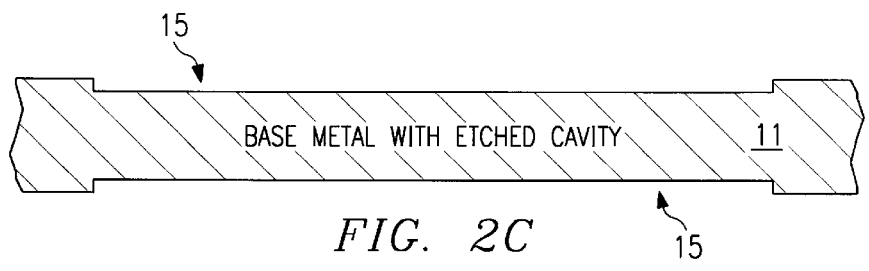
Figure 2D:
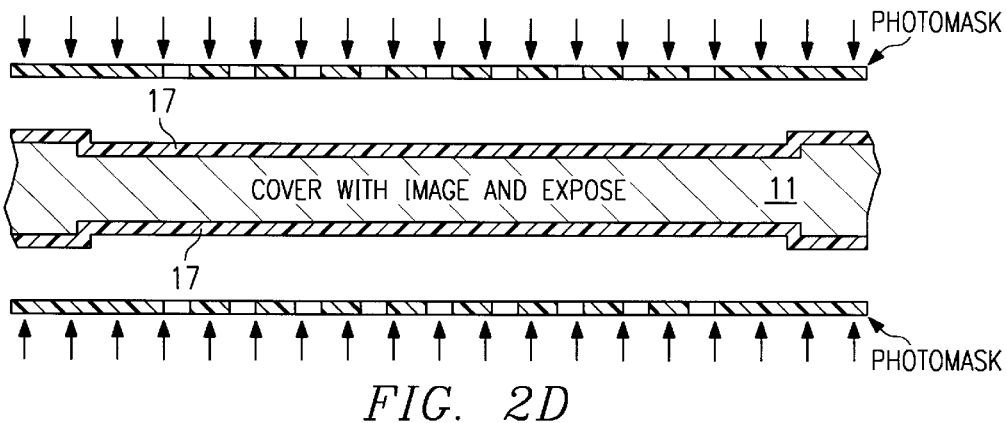
Figure 2E:
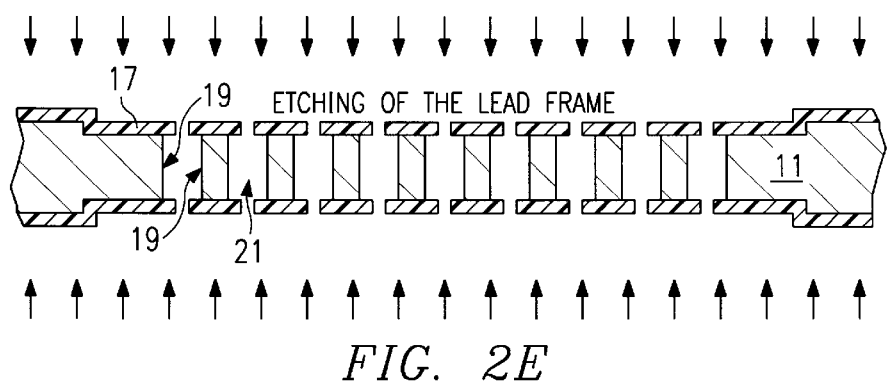
Figure 2F:
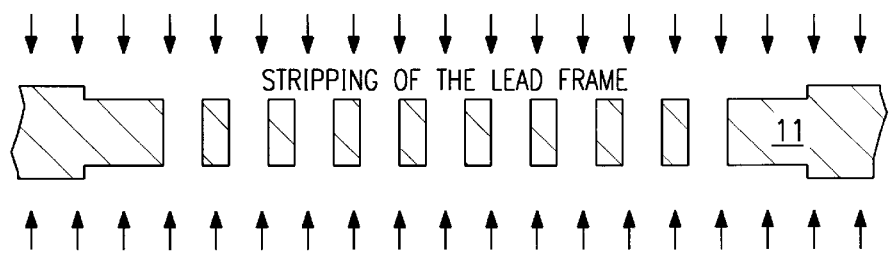

Referring now to FIG. 2A there is shown an electrically conductive base metal, preferably but not limited to a foil starting material 11 which can be a copper or copper-based. The metal 11 is coated with a photo resist 13, preferably, preferably negative and preferably on both major surfaces and the photo resist is masked and exposed in standard manner and developed with the exposed photo resist being removed in standard manner as shown in FIG. 2B. The image is made such that at least the narrow parts of the internal leads will have exposed copper after the developing of the resist. The metal is now sprayed with ferric or cupric chloride to provide etching of the base metal with the etching being stopped as soon as the material thickness remaining is sufficiently thin, forming a cavity 15 and enabling the production of the fine features desired as shown in FIG. 2C at which time the etchant and photo resist are stripped away in standard manner. The entire base metal 11 and cavity 15 are now coated with a photo resist 17, preferably a positive resist and preferably a liquid, to also cover the sidewalls of the cavity 15. The photo resist 17 is then patterned, exposed and developed in standard manner as shown in FIG. 2D and the pattern is again etched as shown in FIG. 2E with the photo resist 17 then being stripped from the lead frame as shown in FIG. 2F to complete this phase of lead frame fabrication. As can be seen in FIG. 2E, the amount of undercutting 19 is substantially reduced and is limited to a small portion of the region 21 etched during the second etching step.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of fabricating a lead frame which comprises the steps of:
   (a) providing an electrically conductive layer having a pair of opposing major surfaces;
   (b) first etching a pattern in said electrically conductive layer extending partially through said electrically conductive layer to form cavities with sidewalls in said electrically conductive layer;
   (c) providing a patterned mask on said electrically conductive layer, said patterned mask masking said sidewalls; and
   (d) then again etching said layer within said cavities, said sidewalls not being etched due to said patterned mask masking said sidewalls in said cavities.

2. The method of claim 1 wherein said patterned mask is a liquid photo resist.

3. The method of claim 1 wherein said electrically conductive layer is one of copper or a copper-based material.

4. The method of claim 2 wherein said electrically conductive layer is one of copper or a copper-based material.

5. The method of claim 1 wherein said first etching takes place from both said major surfaces.

6. The method of claim 2 wherein said first etching takes place from both said major surfaces.

7. The method of claim 3 wherein said first etching takes place from both said major surfaces.

8. The method of claim 4 wherein said first etching takes place from both said major surfaces.

9. The method of claim 1 wherein said etching in step (d) includes etching entirely through at least a portion of said cavities.

10. The method of claim 2 wherein said etching in step (d) includes etching entirely through at least a portion of said cavities.

11. The method of claim 4 wherein said etching in step (d) includes etching entirely through at least a portion of said cavities.

12. The method of claim 5 wherein said etching in step (d) includes etching entirely through at least a portion of said cavities.

13. The method of claim 6 wherein said etching in step (d) includes etching entirely through at least a portion of said cavities.

14. The method of claim 7 wherein said etching in step (d) includes etching entirely through at least a portion of said cavities.

15. The method of claim 8 wherein said etching in step (d) includes etching entirely through at least a portion of said cavities.

16. The method of claim 1 wherein said patterned mask is formed from one of a positive or negative photo resist and said first step of etching a pattern is provided using the other of a positive or negative photo resist.

17. The method of claim 2 wherein said patterned mask is formed from one of a positive or negative photo resist and said first step of etching a pattern is provided using the other of a positive or negative photo resist.

18. The method of claim 4 wherein said patterned mask is formed from one of a positive or negative photo resist and said first step of etching a pattern is provided using the other of a positive or negative photo resist.

19. The method of claim 8 wherein said patterned mask is formed from one of a positive or negative photo resist and said first step of etching a pattern is provided using the other of a positive or negative photo resist.

* * * * *